(12) United States Patent
Seubert et al.

(10) Patent No.: US 12,285,915 B2
(45) Date of Patent: Apr. 29, 2025

(54) METHODS OF POST-CURING ADDITIVE MANUFACTURING PARTS USING ELECTRON BEAMS

(71) Applicant: Ford Global Technologies, LLC, Dearborn, MI (US)

(72) Inventors: Christopher Michael Seubert, New Hudson, MI (US); Mark Edward Nichols, Saline, MI (US); Ellen Cheng-chi Lee, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 720 days.

(21) Appl. No.: 17/371,795

(22) Filed: Jul. 9, 2021

(65) Prior Publication Data

US 2021/0331394 A1    Oct. 28, 2021

Related U.S. Application Data

(63) Continuation of application No. PCT/US2019/012812, filed on Jan. 9, 2019.

(51) Int. Cl.
*B29C 64/30* (2017.01)
*B29C 71/04* (2006.01)
(Continued)

(52) U.S. Cl.
CPC .............. *B29C 64/30* (2017.08); *B29C 71/04* (2013.01); *B33Y 10/00* (2014.12); *B33Y 40/20* (2020.01);
(Continued)

(58) Field of Classification Search
CPC . B29C 71/02; B29C 2071/022; B29C 64/171; B29C 64/176; B29C 64/182
See application file for complete search history.

(56) References Cited

U.S. PATENT DOCUMENTS 5,433,979 A    7/1995  Williams
6,054,250 A    4/2000  Sitzmann et al.
(Continued)

FOREIGN PATENT DOCUMENTS

FR    2355794         1/1978
JP    2016002683   *  1/2016
(Continued)

OTHER PUBLICATIONS

International Search Report for International Application PCT/US2019/012812, mailed Sep. 18, 2019.

*Primary Examiner* — Edmund H Lee
(74) *Attorney, Agent, or Firm* — Burris Law, PLLC

(57) ABSTRACT

A method of forming a part includes 3D printing a photopolymerizable resin and forming a preformed part and subsequently post-curing the preformed part with electron beams. The preformed part may be cured via UV curing. A section of the preformed part post-cured with electron beams may have a thickness of at least 1.0 centimeter, for example, at least 2.0 centimeters or at least 3.0 centimeters. An electron beam dosage to post-cure the preformed part may be between 10 kilogray (kGy) and 100 kGy. The preformed part may be 3D printed using stereolithography (SLA), digital light processing (DLP) or material jetting (MJ) and the photopolymerizable resin may include at least one of an acrylate functional polymer and a methacrylate functional polymer. In the alternative, or in addition to, the photopolymerizable resin may include at least one of a urethane, a polyester, and a polyether.

19 Claims, 3 Drawing Sheets

Figure 3:
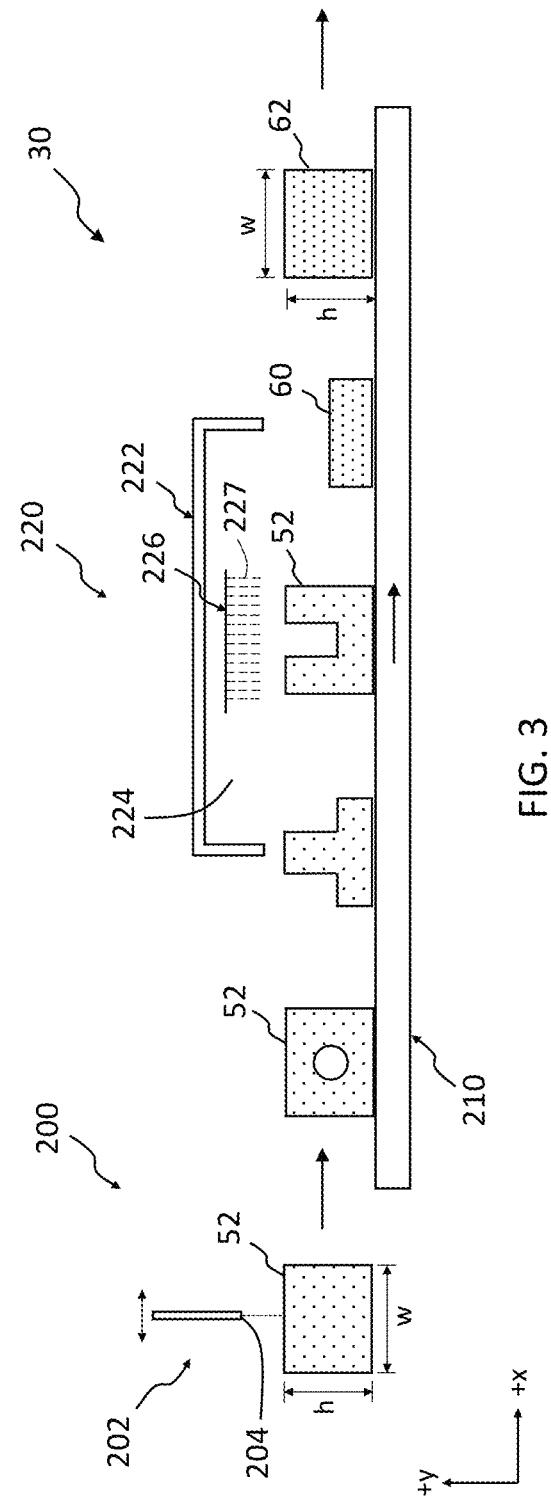

(51) Int. Cl.
*B33Y 10/00* (2015.01)
*B33Y 40/20* (2020.01)
*H01J 37/317* (2006.01)

(52) U.S. Cl.
CPC ....... *H01J 37/317* (2013.01); *H01J 2237/202* (2013.01); *H01J 2237/204* (2013.01); *H01J 2237/3156* (2013.01)

(56) References Cited

U.S. PATENT DOCUMENTS

| | | | | |
|---|---|---|---|---|
| 6,107,008 A | * | 8/2000 | Howell | G03F 7/0037 430/394 |
| 7,258,896 B2 | | 8/2007 | Deckard et al. | |
| 2006/0022379 A1 | * | 2/2006 | Wicker | B33Y 70/00 264/401 |
| 2016/0288433 A1 | * | 10/2016 | Stephenson | B29C 35/0805 |

FOREIGN PATENT DOCUMENTS

| | | | |
|---|---|---|---|
| WO | WO2017112682 | * | 6/2017 |
| WO | 2018156766 | | 8/2018 |

* cited by examiner

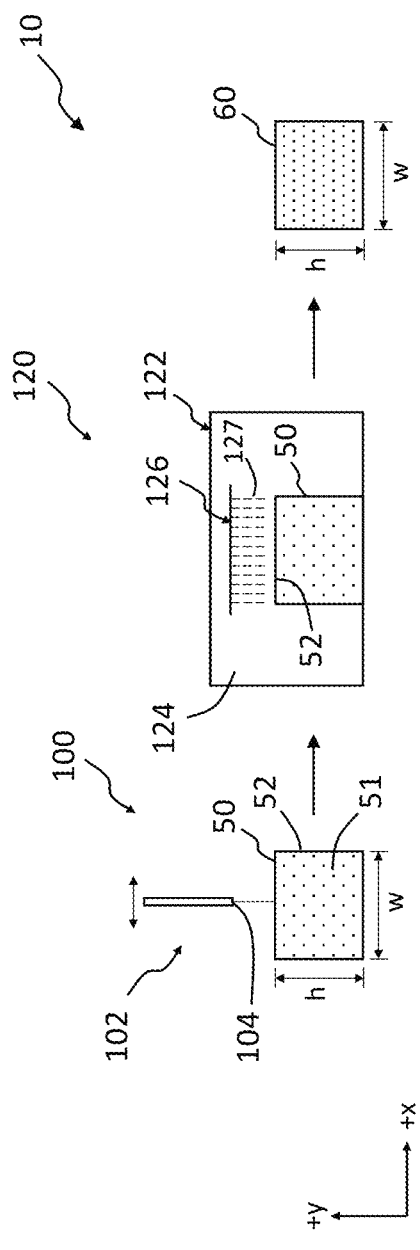
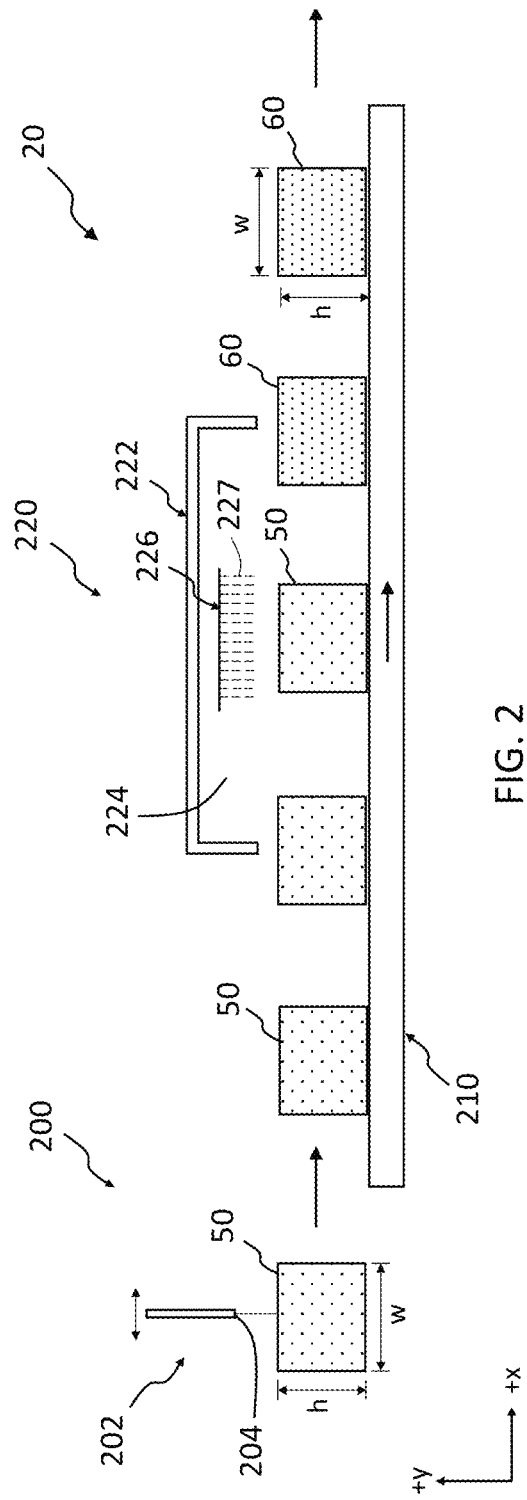
FIG. 1
FIG. 2

METHODS OF POST-CURING ADDITIVE MANUFACTURING PARTS USING ELECTRON BEAMS

CROSS-REFERENCE TO RELATED APPLICATIONS

This application is a continuation of International Application No. PCT/US2019/012812, filed on Jan. 9, 2019. The disclosure of the above application is incorporated herein by reference.

FIELD

The present disclosure relates to additive manufacturing, and particularly, to post-curing of parts formed by additive manufacturing.

BACKGROUND

The statements in this section merely provide background information related to the present disclosure and may not constitute prior art.

Additive manufacturing (AM) (also referred to herein as "3D printing") is a manufacturing technique used to produce parts by sequential deposition and solidification of a material such that a part is gradually assembled in a given direction (typically referred to as the "z-direction"). Ultraviolet (UV) curable resins are used to form polymer AM parts. The UV curable resins polymerize via a free radical reaction when exposed to specific wavelength(s) of UV light. Also, curing of the resins ceases once the UV light is removed and post-processing or post-curing is often needed to improve the "green strength" of the AM parts. Post-curing techniques include additional UV curing and thermal curing. Additional UV curing requires an AM part be thin enough for light to penetrate the entire volume of the AM part and thermal curing requires costly thermally activated crosslinking additives be incorporated within the UV curable resins. Also, thermal curing of thick sections (e.g., ≥1.0 cm) requires extended cure times (e.g., ≥1 hour) and can negatively affect dimensional stability of an AM part if the final polymer has a glass transition temperature (Tg) near the post-cure temperature.

The present disclosure addresses the issues of post-curing AM parts among other issues related to AM using materials that require post-curing.

SUMMARY

This section provides a general summary of the disclosure and is not a comprehensive disclosure of its full scope or all of its features.

In one form of the present disclosure, a method of forming a part includes 3D printing a photopolymerizable resin and forming a preformed part, and subsequently post-curing the preformed part with electron beams. In some aspects of the present disclosure forming of the preformed part includes UV curing and a section of the preformed part post-cured with electron beams has a thickness of at least 1.0 centimeter, for example, at least 2.0 centimeters or at least 3.0 centimeters. An electron beam dosage of the electron beams to post-cure the preformed part is between 10 kilogray (kGy) and 100 kGy. The preformed part may be 3D printed using stereolithography (SLA), digital light processing (DLP) or material jetting (MJ) and the photopolymerizable resin may include at least one of an acrylate functional polymer and a methacrylate functional polymer. In the alternative, or in addition to, the photopolymerizable resin may include at least one of a urethane, a polyester, and a polyether.

In some aspects of the present disclosure, the preformed part has a plurality of sections and each of the plurality of sections have a thickness of at least 1.0 centimeter. In such aspects, the plurality of sections may be oriented non-parallel to each other. Also, the preformed part may or may not rotate while being irradiated by the electron beams.

In some aspects of the present disclosure, the method includes passing the preformed part through an electron beam curing chamber where the preform part is post-cured with the electron beams. Also, the preformed part is post-cured with the electron beams without additional heating of the preformed part.

In another form of the present disclosure, a method of post-curing a plurality of 3D printed preformed parts includes 3D printing a photopolymerizable resin and forming a plurality of preformed parts. The plurality of preformed parts is moved through an electron beam chamber and post-cured via electron beam irradiation. In some aspects of the present disclosure, the plurality of preformed parts have a plurality of sections and at least one of the plurality of sections has a thickness of at least 1.0 centimeter.

In still another form of the present disclosure, a method of post-curing a plurality of 3D printed preformed parts includes 3D printing a photopolymerizable resin using UV curing and forming a plurality of preformed parts. A first subset of the plurality of preformed parts have a different shape than a second subset of the plurality of preformed parts. Also, each of the plurality of preformed parts has at least one section with a dimension equal to or greater than 1.0 centimeter. The plurality of preformed parts is moved through an electron beam curing chamber where the first subset of preformed parts and the second subset of preformed parts are irradiated with electron beams. In some aspects of the present disclosure, each of the first subset of preformed parts are irradiated with the electron beams for a first time period and each of the second subset of preformed parts are irradiated with the electron beams for a second time period equal to the first time period. That is, the first subset of preformed parts and the second subset of preformed parts are irradiated with the electron beams for the same time period. In such aspects, the dosage from the electron beams may or may not be the same for the first subset of preformed parts and the second set of preformed parts. In other aspects of the present disclosure, each of the first subset of preformed parts are irradiated with the electron beams at a first dosage and each of the second subset of preformed parts are irradiated with the electron beams at a second dosage equal to the first dosage. That is, the first subset of preformed parts and the second subset of preformed parts are irradiated with the same dosage. In such aspects, time of irradiation by the electron beams may or may not be the same for the first subset of preformed parts and the second set of preformed parts.

Further areas of applicability will become apparent from the description provided herein. It should be understood that the description and specific examples are intended for purposes of illustration only and are not intended to limit the scope of the present disclosure.

DRAWINGS

Figure 4:
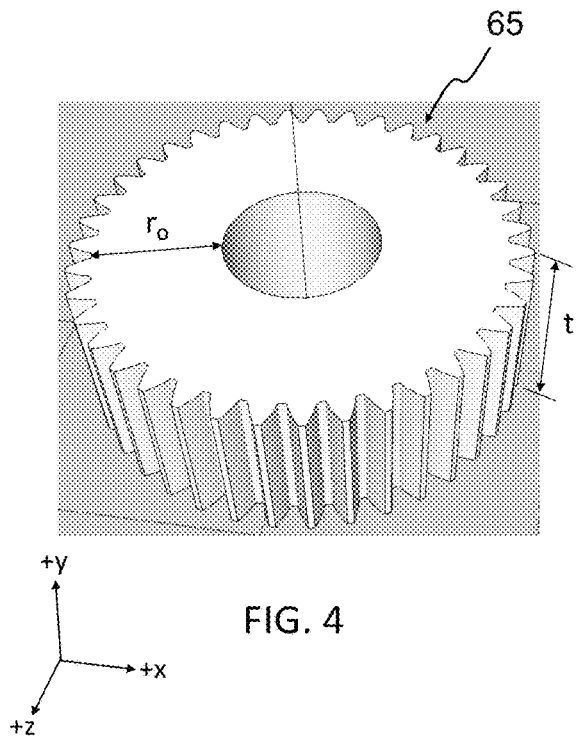
Figure 5:
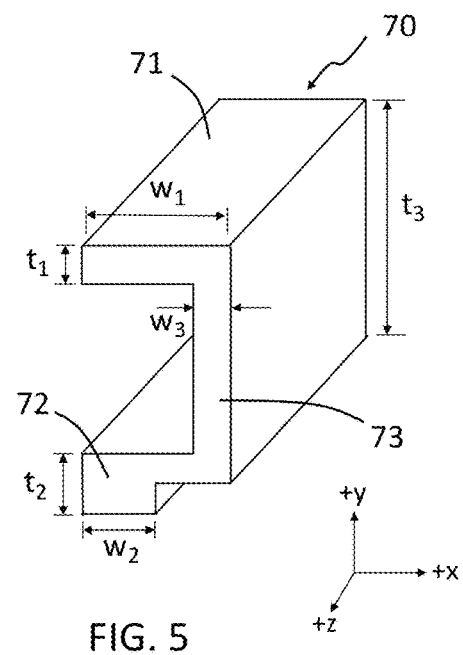
Figure 6:
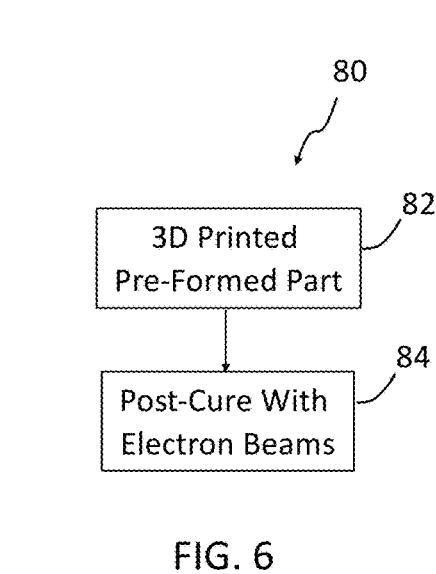
Figure 7:
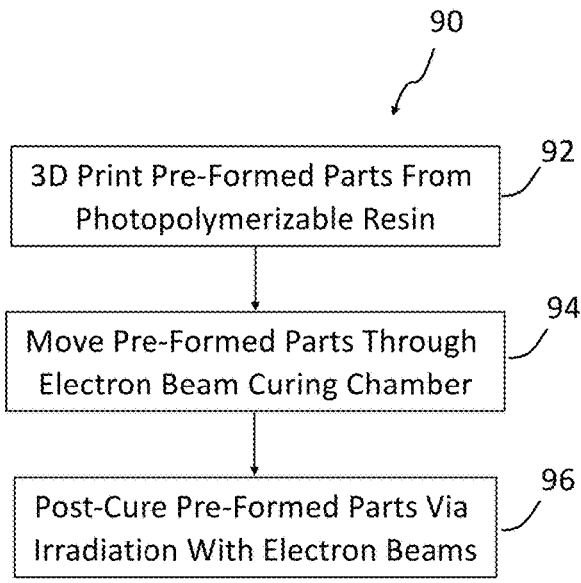

In order that the disclosure may be well understood, there will now be described various forms thereof, given by way of example, reference being made to the accompanying drawings, in which:

FIG. 1 schematically depicts a method for 3D printing and post-curing a preformed part according to the teachings of the present disclosure;

FIG. 2 schematically depicts a method for 3D printing and post-curing a plurality of preformed parts according to the teachings of the present disclosure;

FIG. 3 schematically depicts a method for 3D printing and post-curing a plurality of preformed parts according to the teachings of the present disclosure;

FIG. 4 schematically depicts an exemplary 3D printed part formed by a method according to the teachings of the present disclosure;

FIG. 5 schematically depicts another exemplary 3D printed part formed by a method according to the teachings of the present disclosure;

FIG. 6 is a flow diagram for a method of 3D printing and post-curing a preformed part according to the teachings of the present disclosure; and FIG. 7 is a flow diagram for a method of 3D printing and post-curing a plurality of preformed parts according to the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features. Examples are provided to fully convey the scope of the disclosure to those who are skilled in the art. Numerous specific details are set forth such as types of specific components, devices, and methods, to provide a thorough understanding of variations of the present disclosure. It will be apparent to those skilled in the art that specific details need not be employed and that the examples provided herein, may include alternative embodiments and are not intended to limit the scope of the disclosure. In some examples, well-known processes, well-known device structures, and well-known technologies are not described in detail.

Referring now to FIG. 1, a method 10 of 3D printing and post-curing a 3D printed preformed part according to the teachings of the present disclosure is schematically depicted. The method 10 includes 3D printing a preformed part 50 (also referred to herein simply as "part 50") at a 3D printing station 100 comprising a 3D printer 102 and post-curing the part 50 at a post-curing station 120 such that a post-cured part 60 is provided. In some aspects of the present disclosure the post-cured part 60 is fully cured. As used herein, the phrase "fully cured" refers to sufficient cross-linking within the material used to form the part such that the post-cured part has predefined properties (e.g., mechanical properties, vapor emission properties, solvent resistant properties, etc.) for a given application or use. In some aspects of the present disclosure, the part 50 is formed from a photopolymerizable resin 51. In such aspects the photopolymerizable resin 51 may be a UV curable resin 51 that is UV cured with a UV light 104 during the 3D printing of the part 50 at the 3D printing station 100.

Still referring to FIG. 1, the part 50 is post-cured at the post-curing station 120 via electron beams 127 produced and propagating from an electron beam source 126. The electron beam source 126 is within a chamber 122. It should be understood that electrons in the electron beams ionize molecules in the UV curable resin 51 thereby producing free radicals that cross link with other molecules (with free radicals) such that additional curing of the part 50 occurs and the post-cured part 60 is provided. It should also be understood that penetration of the electron beams 127 into the part 50 is not limited by the opacity of the UV curable resin 51 and thick sections of the part 50 can be post-cured with the electron beams 127. In some aspects of the present disclosure, sections of parts 50 with dimensions equal to or greater than 1.0 centimeter (cm) (i.e., h and/or w≥1.0 cm) can be post-cured with the electron beams. For example, the energy (MeV) the electron beams 127 can be adjusted such that penetration of the electron beams into 3D printed parts enables sections with dimensions greater than 2.0 cm or greater than 3.0 cm to be post-cured according the teachings of the present disclosure. In some aspects of the present disclosure, one or more sections of the parts 50 have a dimension between 1.0 cm and 2.0 cm, between 2.0 cm and 3.0 cm, between 3.0 cm and 4.0 cm, or between 4.0 cm and 5.0 cm. However, in other aspects of the present disclosure, one or more sections of the parts 50 have a dimension less than 1.0 cm, for example, between 1.0 cm and 0.75 cm, between 0.75 cm and 0.50 cm, between 0.50 cm and 0.25 cm, or between 0.25 cm and 0.1 cm. It should be understood that while sections with thinner dimensions, e.g., dimensions less than 0.25 cm, may be fully cured using UV radiation depending on the UV resin 51 used to from the part 50, the electron beams 127 fully cure the UV resin 51 in less than time than with UV curing or thermal curing. That is, electron beam curing of the parts 50 reduces the time for fully curing the parts 50 by at least 50%, for example, by at least 60%, by at least 70%, by at least 80%, or by at least 90%.

The chamber 122 has an interior 124 that may provide an inert atmosphere surrounding the part 50 during post-curing. In the alternative, the interior 124 of the chamber 122 may provide an oxygen containing atmosphere (e.g., air) during posting curing of the part 50. For example, UV curing of the part 50 at the 3D printing station 100 provides a generally non-porous surface 52 such that the permeation of oxygen into the part 50 is retarded. Accordingly, ionization of oxygen that may alter the properties or affect cross-linking of the UV curable resin 51 within the interior of the part 50 during post-curing is prevented and an inert atmosphere is not required.

In some aspects of the present disclosure, the part 50 has a shape and size that is maintained during and after the post-curing of the part 50. For example, and as schematically depicted in FIG. 1, the part 50 has a width 'w' and a height 'h', and the post-cured part 60 has the same width 'w' and height 'h'. In some aspects of the present disclosure, UV curing of the UV curable resin 51 at the 3D printing station 100 provides the part 50 with shape stability such that the part 50 can be moved to the post-curing station 120 without changing its shapes and/or dimensions, and post-curing the part 50 with electron beams 127 at the post-curing station 120 provides the post-cured part 60 with structural and/or chemical stability such that the post-cured part 60 can be used for its intended purpose.

Referring now to FIG. 2, a method 20 of 3D printing and post-curing a plurality of 3D printed parts according to the teachings of the present disclosure is schematically depicted. The method 20 includes 3D printing a plurality of parts 50 at a 3D printing station 200 comprising a 3D printer 202 and post-curing the plurality of parts 50 at a post-curing station 220 such that a plurality of post-cured parts 60 is provided. In some aspects of the present disclosure the post-cured parts 60 are fully cured. The parts 50 may be formed from the UV curable resin 51 and the UV curable resin 51 is UV cured with a UV light 204 during the 3D printing of the parts 50 at the 3D printing station 200.

Still referring to FIG. 2, the parts 50 move through the post-curing station 220 via a conveyor belt 210 at a constant speed (i.e., the conveyor belt 210 provides at a constant line speed) and are post-cured at the post-curing station 220 via electron beams 227 produced and propagating from an electron beam source 226. It should be understood, that in some aspects of the present disclosure, the parts 50 have a shape and size that is maintained during and after post-curing of the parts 50. For example, and as schematically depicted in FIG. 2, the parts 50 have a width 'w' and a height 'h' and the post-cured parts 60 have the same width 'w' and height 'h'. The chamber 222 has an interior 224 that may provide an inert atmosphere surrounding (shielding) the part 50 during post-curing. In the alternative, the interior 224 of the chamber 222 may provide an oxygen containing atmosphere (e.g., air) during posting curing of the part 50.

In some aspects of the present disclosure, UV curing of the UV curable resin 51 at the 3D printing station 200 provides the parts 50 with shape stability such that the parts 50 can be moved to the post-curing station 220 without changing their shapes and/or dimensions and post-curing the parts 50 with electron beams 227 at the post-curing station 220 provides the post-cured part 60 with structural and/or chemical stability such that the post-cured parts 60 can be used for its intended purpose.

While FIG. 2 schematically depicts the parts 50 having the same shape and size, it should be understood that 3D printed parts with different shapes and sizes can be post-cured according the teachings of the present disclosure. For example, and with reference to FIG. 3, a method 30 of 3D printing and post-curing a plurality of 3D printed parts with different shapes and sizes according to the teachings of the present disclosure is schematically depicted. The method 30 includes 3D printing a plurality of parts 52 with different shapes and sizes at the 3D printing station 200 and post-curing the plurality of parts 52 at the post-curing station 220 such that a plurality of post-cured parts 62 is provided. In some aspects of the present disclosure the post-cured parts 62 are fully cured. Also, the parts 52 may be formed from the UV curable resin 51 and the UV curable resin 51 is UV cured with the UV light 204 during the 3D printing of the parts 52 at the 3D printing station 200.

In some aspects of the present disclosure the parts 52 move through the post-curing station 220 via the conveyor belt 210 at a constant speed. In such aspects, the energy of the electron beams 227 and/or the dosage provided by the electron beams 227 may or may not be constant during post-curing of each part 52. For example, the energy of the electron beams 227 and/or the dosage provided by the electron beams 227 may be adjusted as the parts 52 move through the post-curing station 220 at a constant line speed. In the alternative, the energy of the electron beams 227 and/or the dosage provided by the electron beams 227 may be constant as the parts 52 move through the post-curing station 220 at a constant line speed. In other aspects of the present disclosure, the energy of the electron beams 227 and/or the dosage provided by the electron beams 227 is constant and the line speed is adjusted as the parts 52 move through the post-curing station 220 via the conveyor belt 210. For example, the line speed of the conveyor belt 210 may be reduced as parts 52 having comparatively thicker sections move through the post-curing station 220.

While FIGS. 2 and 3 schematically depict a single 3D printer 102, 202 forming a plurality of parts 50, 52 that are post-cured at the post-curing station 120, 220, respectively, it should be understood that more than one 3D printer may be used to form a plurality of parts that are post-cured at a single post-curing station. It should also be understood that more than one post-curing station may be used to post-cure a plurality parts from a single 3D printer.

Referring now to FIGS. 4 and 5, non-limiting examples of 3D printed parts post-cured with electron beams according to the teachings of the present disclosure are schematically depicted. Particularly, a gear 65 is schematically depicted in FIG. 4 and a polygonal-shaped bracket 70 is schematically depicted in FIG. 5. The gear 65 (FIG. 4) has a thickness 't' and a radial thickness '$r_o$'. In some aspects of the present disclosure the thickness t and/or radial thickness $r_o$ may be between 1.0 cm and 2.0 cm, between 2.0 cm and 3.0 cm, between 3.0 cm and 4.0 cm, or between 4.0 cm and 5.0 cm. The polygonal-shaped bracket 70 has three sections, i.e., a first section 71 with a thickness '$t_1$' and width '$w_1$', a second section 72 with a thickness '$t_2$' and a width '$w_2$', and a third section 73 with a thickness '$t_3$' and a width '$w_3$'. Also, the second section 72 is spaced apart from the first section 71. In some aspects of the present disclosure, $t_1$ and/or $w_1$ of the first section 71, $t_2$ and/or $w_2$ of the second section 72, and/or $t_3$ and/or $w_3$ of the third section 73 may be between 1.0 cm and 2.0 cm, between 2.0 cm and 3.0 cm, between 3.0 cm and 4.0 cm, or between 4.0 cm and 5.0 cm. However, penetration of the electron beams 227 enable the post-curing station 220 to post-cure parts such as gears 60 and polygonal-shaped brackets 70 in a time period of seconds as opposed to thermal curing of such parts which requires time periods of minutes and hours. Particularly, in some aspects of the present disclosure preformed 3D printed parts with thick sections (i.e., sections with a thickness between 1.0 cm and 5.0 cm) are post-cured with electron beams according to the teachings of the present disclosure in less than 60 seconds, for example, in less than 45 seconds or less than 30 seconds. In contrast, thermal curing of preformed 3D printed parts with thick sections requires one hour or more. Also, it should be understood that while sections with thinner dimensions, e.g., dimensions less than 0.25 cm, may be fully cured using UV radiation depending on the UV resin used to from a particular part, electron beams fully cure the UV resin in less than time than with UV curing or thermal curing. That is, electron beam curing of the parts, even thin section parts (e.g., less than 0.25 cm thick), reduces the time for fully curing the parts 50 by at least 50%, for example, by at least 60%, by at least 70%, by at least 80%, or by at least 90%.

As noted above, in some aspects of the present disclosure, the energy of the electron beams 227 and/or the dosage provided by the electron beams 227 is constant and the rate of movement (i.e., line speed) of the parts 52 through the chamber 222 is altered depending on the shape and size of a given part 52. In other aspects of the present disclosure, the rate of movement of the parts 52 through the chamber 222 is constant and the energy of the electron beams 227 and/or the dosage provided by the electron beams 227 is altered depending on the shape and size of a given part 52. In still other aspects, the size and shape and of the parts 52 is such that post-cured parts 62 are provided with the energy of the electron beams 227 and/or the dosage provided by the electron beams 227 being constant and the rate of movement of the parts 52 through the chamber 222 being constant.

Referring now to FIG. 6, a flow diagram for a method of post-curing a 3D preformed part is schematically depicted at reference numeral 80. The method 80 includes providing a 3D printed preformed part at step 82 and post-curing the 3D printed preformed part with electron beams at step 84.

Referring now to FIG. 7, a flow diagram for a method of post-curing a plurality of 3D preformed parts is schematically depicted at reference numeral 90. The method 90 includes 3D printing a plurality of preformed parts from a photopolymerizable resin (e.g., a UV curable resin) at step 92 and moving the plurality of preformed parts through an electron beam chamber at step 94. The plurality of preformed parts is irradiated with electron beams in the electron chamber and post-cured at step 96.

Although the terms first, second, third, etc. may be used to describe various elements, components, regions, sections, and/or time periods, these elements, components, regions, sections, and/or time periods should not be limited by these terms. These terms may be only used to distinguish one element, component, region, section, and/or time period, from another element, component, region, layer and/or section. Terms such as "first," "second," and other numerical terms when used herein do not imply a sequence or order unless clearly indicated by the context. Thus, a first element, component, region, layer and/or section, could be termed a second element, component, region, layer and/or section without departing from the teachings of the example forms. Furthermore, an element, component, region, layer and/or section may be termed a "second" element, component, region, layer and/or section, without the need for an element, component, region, layer and/or section termed a "first" element, component, region, layer and/or section.

As used herein, the phrase at least one of A, B, and C should be construed to mean a logical (A OR B OR C), using a non-exclusive logical OR, and should not be construed to mean "at least one of A, at least one of B, and at least one of C.

Unless otherwise expressly indicated, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, manufacturing technology, and testing capability.

The terminology used herein is for the purpose of describing particular example forms only and is not intended to be limiting. The singular forms "a," "an," and "the" may be intended to include the plural forms as well, unless the context clearly indicates otherwise. The terms "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

The description of the disclosure is merely exemplary in nature and, thus, examples that do not depart from the substance of the disclosure are intended to be within the scope of the disclosure. Such examples are not to be regarded as a departure from the spirit and scope of the disclosure. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A method of forming a part comprising;
   3D printing a photopolymerizable resin to form a preformed part, the preformed part having a plurality of sections of different thickness, wherein at least one section of the preformed part post-cured with electron beams comprises a thickness of at least 1.0 centimeter;
   subsequently post-curing the preformed part with electron beams; and
   adjusting the energy of the electron beams and a duration of post-curing for each of the plurality of sections based on the thickness of the section.

2. The method according to claim 1, wherein the preformed part is cured via UV curing.

3. The method according to claim 1, wherein a section of the preformed part post-cured with electron beams comprises a thickness of at least 2.0 centimeters.

4. The method according to claim 1, wherein a section of the preformed part post-cured with electron beams comprises a thickness of at least 3.0 centimeters.

5. The method according to claim 1, wherein the preformed part is 3D printed via at least one of stereolithography (SLA), digital light processing (DLP) and material jetting (MJ).

6. The method according to claim 1, wherein the preformed part comprises a plurality of sections and each of the plurality of sections have a thickness of at least 1.0 centimeter.

7. The method according to claim 6, wherein the plurality of sections are oriented non-parallel to each other.

8. The method according to claim 1, wherein the preformed part rotates while the electron beams are stationary during post-curing.

9. The method according to claim 1, wherein the photopolymerizable resin comprises at least one of an acrylate functional polymer and a methacrylate functional polymer.

10. The method according to claim 1, wherein the photopolymerizable resin comprises at least one of a urethane, a polyester, and a polyether.

11. The method according to claim 10, wherein an electron beam dosage of the electron beams to post-cure the preformed part is between 10 kGy and 100 kGy.

12. The method according to claim 1 further comprising passing the preformed part through an electron beam curing chamber where the preform part is post-cured with the electron beams.

13. The method according to claim 1, wherein the preform part is post-cured without external heating.

14. A method of post-curing a plurality of 3D printed preformed parts comprising:
   3D printing photopolymerizable resin to form a plurality of preformed parts, wherein a section of the preformed part post-cured with electron beams comprises a thickness of at least 1.0 centimeter;
   moving the plurality of preformed parts through an e-beam chamber comprising electron beams, wherein each of the plurality of preformed parts is irradiated with the electron beams and post-cured; and
   adjusting the energy of the electron beams and the duration of post-curing for each of the plurality of preform parts based on the thickness of the section, where the duration of post-curing is less than 60 seconds.

15. The method according to claim 14, wherein the plurality of preformed parts are UV cured during 3D printing of the photopolymerizable resin.

16. The method according to claim 14, wherein each of the plurality of preformed parts comprises a plurality of sections and at least one of the plurality of sections has a thickness of at least 1.0 centimeter.

17. A method of post-curing a plurality of 3D printed preformed parts comprising:
- 3D printing photopolymerizable resin using UV curing to form a plurality of preformed parts, wherein a first subset of the plurality of preformed parts have a different shape than a second subset of the of the plurality of preformed parts and each of plurality of preformed parts each comprise at least one section with a dimension equal to or greater 1.0 centimeter;
- moving the plurality of preformed parts through an electron beam curing chamber comprising electron beams; and
- irradiating the first subset of preformed parts at a first electron beam dosage and the second subset of preformed parts at a second electron beam dosage with the electron beams as the plurality of preformed parts move through the electron beam curing chamber.

18. The method according to claim 17, wherein each of the first subset of preformed parts are irradiated with the electron beams for a first time period and each of the second subset of preformed parts are irradiated with the electron beams for a second time period equal to the first time period.

19. The method according to claim 17, wherein each of the first subset of preformed parts are irradiated with the electron beams at a first dosage and each of the second subset of preformed parts are irradiated with the electron beams at a second dosage equal to the first dosage.

* * * * *